United States Patent
Huang et al.

(10) Patent No.: US 10,715,114 B1
(45) Date of Patent: Jul. 14, 2020

(54) FILTER AND OPERATING METHOD THEREOF

(71) Applicant: uPI Semiconductor Corp., Hsinchu County (TW)

(72) Inventors: Chao-Chung Huang, Hsinchu County (TW); Kuo-Jen Kuo, Hsinchu County (TW); Yi-Xian Jan, Hsinchu County (TW)

(73) Assignee: uPI Semiconductor Corp., Hsinchu County (TW)

( * ) Notice: Subject to any disclaimer, the term of this patent is extended or adjusted under 35 U.S.C. 154(b) by 0 days.

(21) Appl. No.: 16/591,642

(22) Filed: Oct. 3, 2019

(30) Foreign Application Priority Data

Dec. 19, 2018 (CN) .......................... 2018 1 1557626

(51) Int. Cl.
| | |
|---|---|
| *H03K 5/00* | (2006.01) |
| *H03B 1/00* | (2006.01) |
| *H03F 1/32* | (2006.01) |
| *H03H 19/00* | (2006.01) |
| *H03K 17/687* | (2006.01) |
| *H03F 3/45* | (2006.01) |
| *H03F 3/19* | (2006.01) |

(52) U.S. Cl.
CPC ............. *H03H 19/004* (2013.01); *H03F 3/19* (2013.01); *H03F 3/45179* (2013.01); *H03K 17/687* (2013.01)

(58) Field of Classification Search
CPC ..... H03F 3/45179; H03F 3/19; H03H 19/004; H03K 17/687
See application file for complete search history.

(56) References Cited

U.S. PATENT DOCUMENTS

| | | | |
|---|---|---|---|
| 4,763,081 A | 8/1988 | Jason | |
| 5,124,593 A * | 6/1992 | Michel | H03H 11/04 |
| | | | 327/554 |
| 6,366,161 B1 * | 4/2002 | Koazechi | H03H 11/1291 |
| | | | 327/553 |
| 8,390,361 B2 | 3/2013 | Ningrat | |
| 8,594,605 B2 * | 11/2013 | Katsube | H03H 11/1291 |
| | | | 455/307 |

FOREIGN PATENT DOCUMENTS

CN 101308393 11/2008

* cited by examiner

*Primary Examiner* — Kenneth B Wells
(74) *Attorney, Agent, or Firm* — JCIPRNET (57) ABSTRACT

A filter and an operating method thereof are provided. The filter includes a logic circuit, a power circuit and a filter circuit. The logic circuit provides a switching control signal. The power circuit is coupled to the logic circuit. The filter circuit is coupled to the power circuit and the logic circuit. The filter circuit includes an amplifier, a first capacitor and a first transistor. An output end of the amplifier is coupled to the logic circuit, and provides an output signal. The first capacitor is coupled between an input end and output end of the amplifier. The first transistor is connected in parallel with the first capacitor. A control end of the first transistor is coupled to the power circuit. The logic circuit provides a switching control signal to the power circuit according to the output signal. The power circuit supplies a control voltage to the first transistor according to the switching control signal. Therefore, the filter of the present invention and its method of operation can provide an accurate filtered signal output function.

9 Claims, 7 Drawing Sheets

FILTER AND OPERATING METHOD THEREOF

CROSS-REFERENCE TO RELATED APPLICATION

This application claims the priority benefit of China application serial no. 201811557626.7, filed on Dec. 19, 2018. The entirety of the above-mentioned patent application is hereby incorporated by reference herein and made a part of this specification.

BACKGROUND OF THE INVENTION

1. Field of the Invention

The present invention generally relates to a circuit, in particular, to a filter and an operating method thereof.

2. Description of Related Art

In a circuit architecture of an existing filter, a transistor may usually be applied to the circuit architecture of the filter as a pseudo-resistor due to a specific operation characteristic thereof. However, since a threshold voltage Vth of a transistor may change with a temperature or a manufacturing procedure to correspondingly change a current flowing through the transistor, equivalent resistance value of the transistor is likely to change with the temperature to generate a great offset. In view of this, how to reduce an equivalent resistance value change brought by a manufacturing procedure and a temperature to a pseudo-resistor to improve output accuracy is a problem to be solved in the industry.

SUMMARY OF THE INVENTION

The present invention provides a filter and an operating method thereof, which may effectively reduce a change brought by a manufacturing process and a temperature to a pseudo-resistor to provide an accurate filter signal output function.

A filter of the present invention includes a logic circuit, a power circuit and a filter circuit. The logic circuit provides a switching control signal. The power circuit is coupled to the logic circuit. The filter circuit is coupled to the power circuit and the logic circuit. The filter circuit includes an amplifier, a first capacitor and a first transistor. The amplifier has an input end and an output end. The output end is coupled to the logic circuit, and provides an output signal. The first capacitor is coupled between the input end and output end of the amplifier. The first transistor is connected in parallel with the first capacitor. A control end of the first transistor is coupled to the power circuit. The logic circuit provides the switching control signal to the power circuit according to the output signal. The power circuit provides a control voltage to the first transistor according to the switching control signal.

In an embodiment of the present invention, when the control voltage is a temperature compensated first voltage, the first transistor is operated in a cut-off region. When the control voltage is a fixed second voltage, the first transistor is operated in a saturation region.

In an embodiment of the present invention, the power circuit includes a voltage source, a fixed current source, a second transistor and a switching circuit. The voltage source provides a second voltage. The second transistor is matched with the first transistor, and is coupled to the fixed current source to generate a first voltage. The switching circuit is coupled to the logic circuit, and switches the control voltage to the first voltage or the second voltage according to the switching control signal.

In an embodiment of the present invention, the logic circuit includes a comparison circuit. The comparison circuit is coupled to a first output end of the amplifier, and judges whether the output signal is higher than a first preset value or lower than a second preset value and output a comparison signal.

In an embodiment of the present invention, the logic circuit further includes a delay circuit. The delay circuit is coupled to the comparison circuit and the power circuit, and delays the comparison signal for a preset time.

In an embodiment of the present invention, the filter circuit further includes a second capacitor and a third transistor. The second capacitor is coupled between another input end and another output end of the amplifier. The third transistor is connected in parallel with the second capacitor, and a control end of the third transistor is coupled to the power circuit. The power circuit provides the control voltage to the third transistor according to the switching control signal.

In an embodiment of the present invention, an input signal includes a plurality of sub input signals, and the plurality of sub input signals are switched according to an external switching control signal. The logic circuit generates the switching control signal according to the external switching control signal and the output signal.

An operating method of the present invention is applied to a filter. The filter includes an amplifier and a first transistor. The first transistor is coupled between an output end and input end of the amplifier. The operating method includes the following steps: a switching control signal is provided to a control end of the first transistor; and a control voltage is switched to a first voltage or a second voltage according to an output signal of the output end of the amplifier.

In an embodiment of the present invention, when the control voltage is the temperature compensated first voltage, the first transistor is operated in a cut-off region. When the control voltage is the fixed second voltage, the first transistor is operated in a saturation region.

In an embodiment of the present invention, the operating method further includes that the first voltage is generated according to a second transistor matched with the first transistor and a fixed current source.

Based on the above, according to the filter and operating method thereof of the present invention, the temperature compensated control voltage may be provided to the transistor serving as a pseudo-resistor in the filter circuit, so that the filter circuit may run stably. Moreover, in case of saturated output of the filter circuit, the transistor may be correspondingly operated to be switched on to effectively reset the filter. Therefore, according to the filter and operating method thereof of the present invention, a stable and accurate filter signal output function may be provided.

In order to make the aforementioned and other objectives and advantages of the present invention comprehensible, embodiments accompanied with figures are described in detail below.

DESCRIPTION OF THE EMBODIMENTS

In order to make the content of the present invention more comprehensible, embodiments are described below as examples of implementation of the present invention. Wherever possible, the same reference numbers are used in the drawings and the description to refer to the same or like parts, components or steps.

Figure 1:
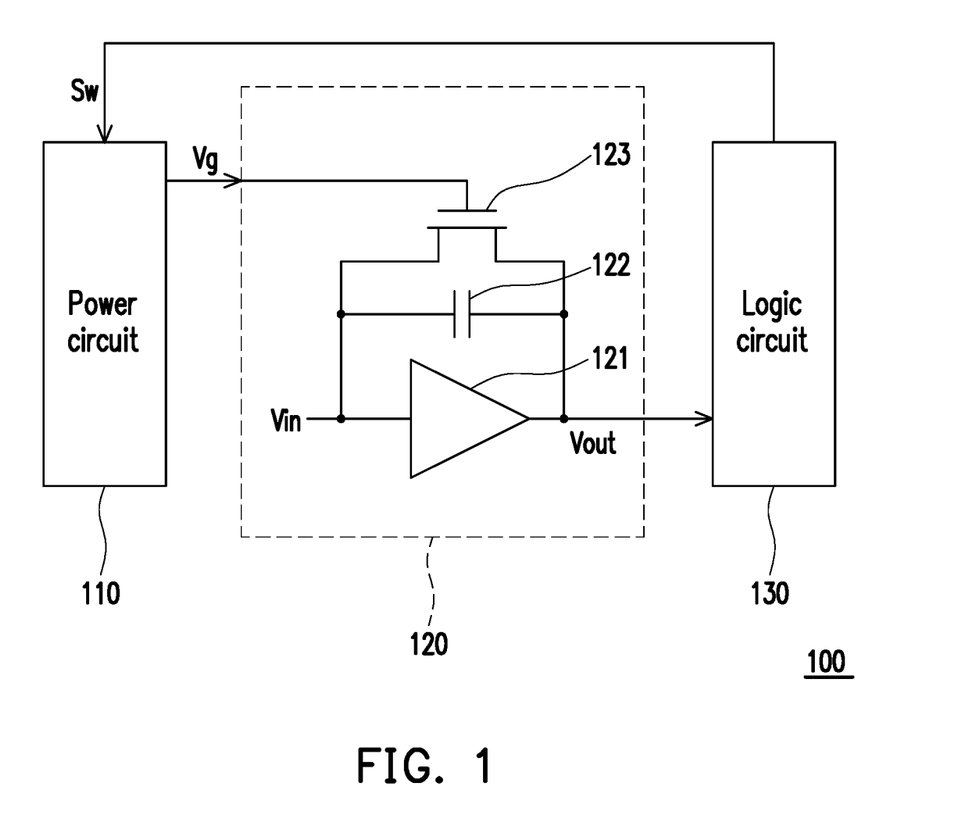
FIG. 1 is a circuit schematic diagram of a filter according to an embodiment of the present invention.

FIG. 1 is a circuit schematic diagram of a filter according to an embodiment of the present invention. Referring to FIG. 1, the filter 100 includes a power circuit 110, a filter circuit 120 and a logic circuit 130. The filter circuit 120 includes an amplifier 121, a capacitor 122 and a transistor 123. An output end of the amplifier 121 is coupled to the logic circuit 130. A first end of the transistor 123 is coupled to the output end of the amplifier 121, and a second end of the transistor 123 is coupled to an input end of the amplifier 121. A first end of the capacitor 122 is coupled to the output end of the amplifier 121, and a second end of the capacitor 122 is coupled to the input end of the amplifier 121. The capacitor 122 is connected in parallel with the transistor 123, and a control end of the transistor 123 is coupled to the power circuit 110. In the present embodiment, when the transistor 123 is operated in a cut-off region, the transistor 123 is equivalent to a resistor such that the filter circuit 120 may stably filter an input signal Vin. However, when the transistor 123 is operated in a saturation region, the transistor 123 is switched on to discharge the capacitor 122 and reset the filter circuit 120.

Specifically, the filter circuit 120 receives, through the input end of the amplifier 121, the input signal Vin and outputs, through the output end of the amplifier 121, a filtered output signal Vout. The logic circuit 130 provides a switching control signal Sw to the power circuit 110 according to the output signal Vout such that the power circuit 110 may output a control voltage Vg to the control end of the transistor 123 according to the switching control signal Sw. In the present embodiment, the logic circuit 130 is configured to judge whether a saturated output condition occurs to the output signal Vout or not. When the filter circuit 120 operates normally, the power circuit 110 provides the temperature compensated control voltage Vg to operate the transistor 123 in the cut-off region to make the transistor 123 equivalent to the resistor. When the capacitor 122 is saturated by an excessively high voltage of the input signal Vin to make it impossible for the filter circuit 120 to implement filtering normally, the power circuit 110 changes the control voltage Vg to operate and switch on the transistor 123 in the saturation region to discharge the capacitor 122 and reset the filter circuit 120. In addition, the transistor 123 may be an N-type transistor or a P-type transistor, and a type of the transistor 123 is not limited in the present invention. In an embodiment, the transistor 123 may be, for example, an N-type Metal Oxide Semiconductor (NMOS) transistor or a P-type Metal Oxide Semiconductor (PMOS) transistor.

Figure 2:
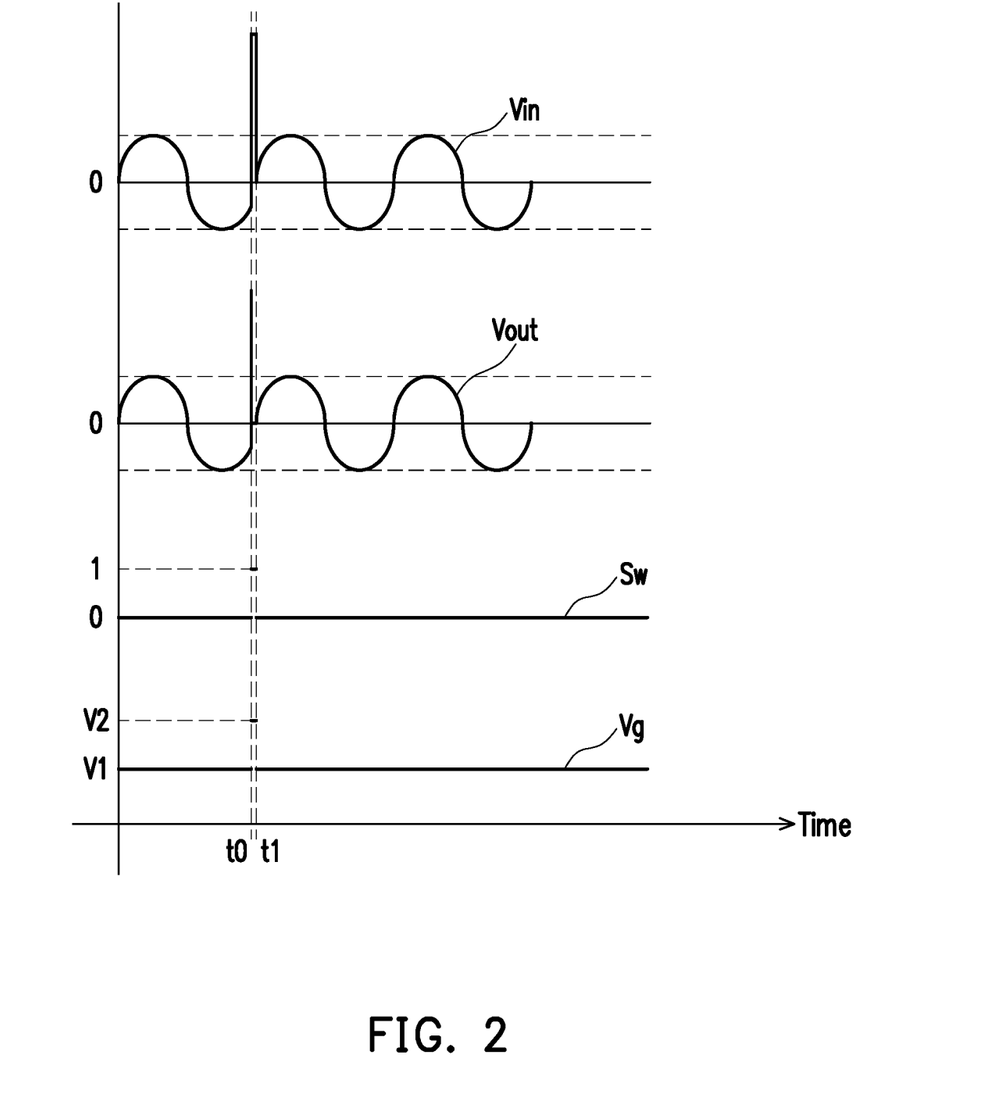
FIG. 2 is a waveform diagram of signals in the embodiment shown in FIG. 1 according to the present invention.

FIG. 2 is a waveform diagram of signals in the embodiment shown in FIG. 1 according to the present invention. Referring to both FIG. 1 and FIG. 2, in the present embodiment, the input signal Vin may be a sine/cosine wave signal and may be, for example, an Electrocardiogram (ECG) signal, but the present invention is not limited thereto. As shown in FIG. 2, before a time point t0, the filter circuit 120 implements filtering normally, and a logic value provided by the switching control signal Sw is "0". The power circuit 110, responsive to the switching control signal Sw, maintains the control voltage Vg to be a temperature compensated first voltage V1 such that the transistor 123 may be operated stably in the cut-off region and is equivalent to the resistor.

Then, at the time point t0, if the filter circuit 120 receives a surge of the input signal Vin, the filter circuit 120 correspondingly outputs the output signal Vout with a relatively high voltage and the saturated output condition occurs. In such case, the logic circuit 130 immediately switches the logic value of the switching control signal Sw to be "1" according to a voltage change of the output signal Vout. The power circuit 110, responsive to the switching control signal Sw, switches the control voltage Vg to a second voltage V2 such that the transistor 123 operates in the saturation region. In such case, the transistor 123 is operated in an on state to discharge the capacitor 122 and reset the filter circuit 120. That is, from the time point t0 to a time point t1, the transistor 123 is kept in the on state to completely discharge the capacitor 122. In the present embodiment, the transistor 123 is an N-type transistor, and a voltage value of the second voltage V2 is higher than the first voltage V1. If the transistor 123 adopts a P-type transistor, a voltage value of the first voltage V1 is higher than the second voltage V2.

After the time point t1, the filter circuit 120 receives the input signal Vin that is a normal sine/cosine wave signal again such that the logic circuit 130 correspondingly switches the logic value of the switching control signal Sw to be "0". Moreover, the power circuit 110, responsive to the switching control signal Sw, switches the control voltage Vg to the first voltage V1 to operate the transistor 123 in the cut-off region again. Since the capacitor 122 is completely discharged, the output signal Vout may be restarted to be generated by a corresponding voltage level. Therefore, according to the filter 100 of the present embodiment, an error of the output signal Vout of the amplifier 121 after the time point t1 due to saturated output may be effectively avoided. However, the logic value of each signal in the present invention is not limited to the present embodiment, and the logic value of each signal may be determined according to different logic circuit designs.

Figure 3:
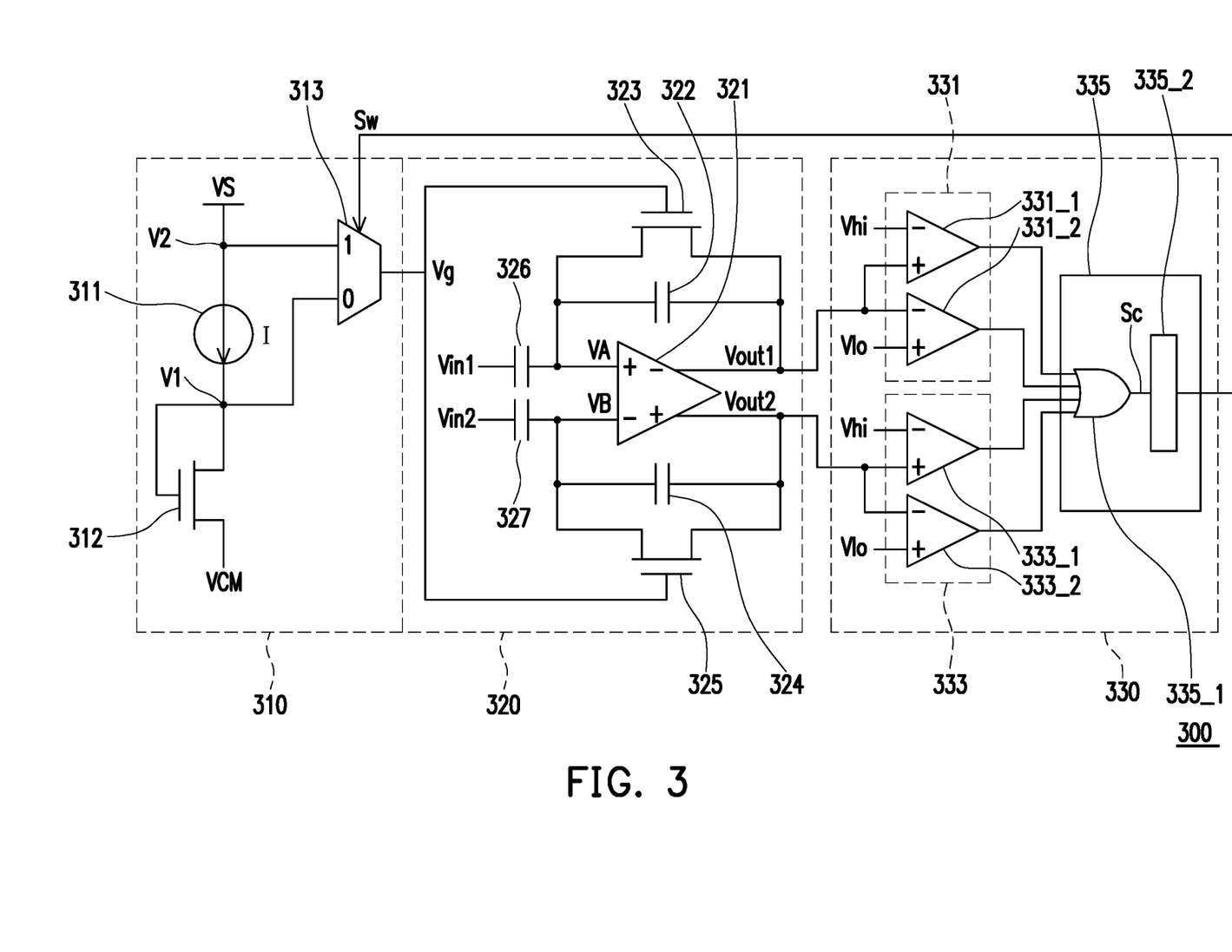
FIG. 3 is a circuit schematic diagram of a differential input filter according to an embodiment of the present invention.

FIG. 3 is a circuit schematic diagram of a differential input filter according to an embodiment of the present invention. Referring to FIG. 3, the filter 300 includes a power circuit 310, a filter circuit 320 and a logic circuit 330. The power circuit 310 includes a voltage source VS, a fixed current source 311, a transistor 312 and a switching circuit 313. The voltage source VS is coupled to one end of the fixed current source 311, and another end of the current source 311 is coupled to a first end of the transistor 312 to generate a first voltage V1. A second end of the transistor 312 is coupled to a common-mode voltage VCM, and a control end of the transistor 312 is coupled to the first end of the transistor 312. One end of the switching circuit 313 is coupled to the voltage source VS, and the other end is coupled to the first end of the transistor 312. The switching circuit 313 may be, for example, a multiplexer, but the present invention is not limited thereto. The switching circuit 313 receives a switching control signal Sw and determines that an output control voltage Vg is the first voltage V1 or a second voltage V2 according to a logic value of the switching control signal Sw.

The filter circuit 320 includes an amplifier 321, capacitors 322 and 324 and transistors 323 and 325. First ends of the transistors 323 and 325 are coupled to an inverting output end and non-inverting output end of the amplifier 321 respectively, and second ends of the transistors 323 and 325 are coupled to a non-inverting input end and inverting input end of the amplifier 321 respectively. The inverting output end and non-inverting output end of the amplifier 321 are coupled to the logic circuit 330. First ends of the capacitors 322 and 324 are coupled to the inverting output end and non-inverting output end of the amplifier 321 respectively, and second ends of the capacitors 322 and 324 are coupled to the non-inverting input end and inverting input end of the amplifier 321 respectively. The transistor 323 is connected in parallel with the capacitor 322, and the transistor 325 is connected in parallel with the capacitor 324. Control ends of the transistors 323 and 325 are coupled to the power circuit 310 respectively to receive the control voltage Vg. In the present embodiment, the non-inverting input end of the amplifier 321 receives, through a capacitor 326, an input signal Vin1, and the inverting input end of the amplifier 321 receives, through a capacitor 327, an input signal Vin2. The input signal Vin1 and the input signal Vin2 are differential signals. The amplifier 321 provides, through the inverting output end and the non-inverting output end, output signals Vout1 and Vout2 according to the input signals Vin1 and Vin2.

It is to be noted that the transistors 323 and 325 are identical transistors, and the transistor 312 is matched with the transistors 323 and 325. The second ends of the transistors 323 and 325 have common-mode voltages VA and VB respectively, and the common-mode voltages VA, VB and VCM have the same voltage value. In other words, the transistors 312, 323 and 325 may have the same change in a threshold voltage Vth at the same temperature. Moreover, since a fixed current I passing through the transistor 312 may not change with temperature, currents passing through the transistors 323 and 325 may also not change with temperature. Therefore, according to the filter circuit 320 of the present embodiment, a resistance value change brought by a manufacturing procedure or the temperature to a pseudo-resistor may be effectively reduced, a drifting condition of a cut-off frequency of the amplifier 321 is further reduced, and output accuracy is improved.

The logic circuit 330 includes comparison circuits 331 and 333 and a delay circuit 335. Output ends of the comparison circuits 331 and 333 are coupled to the delay circuit 335, and input ends of the comparison circuits 331 and 333 are coupled to the inverting output end and non-inverting output end of the amplifier 321 respectively. An output end of the delay circuit 335 is coupled to the switching circuit 313 of the power circuit 310 to provide the switching control signal Sw. The comparison circuit 331 includes comparators 331_1 and 331_2. A non-inverting input end of the comparator 331_1 is coupled to the inverting output end of the amplifier 321, and an inverting input end of the comparator 331_1 is coupled to a reference voltage Vhi. A non-inverting input end of the comparator 331_2 is coupled to a reference voltage Vlo, and an inverting input end of the comparator 331_1 is coupled to the inverting output end of the amplifier 321. The comparison circuit 333 includes comparators 333_1 and 333_2. A non-inverting input end of the comparator 333_1 is coupled to the non-inverting output end of the amplifier 321, and an inverting input end of the comparator 333_1 is coupled to the reference voltage Vhi. A non-inverting input end of the comparator 333_2 is coupled to the reference voltage Vlo, and an inverting input end of the comparator 333_1 is coupled to the non-inverting output end of the amplifier 321. The reference voltage Vhi is higher than the reference voltage Vlo.

The delay circuit 335 includes an OR gate 335_1 and a delay circuit 335_2. An input end of the OR gate 335_1 is coupled to the output ends of the comparators 331_1, 331_2, 333_1 and 333_2, and an output end of the OR gate 335_1 is coupled to the delay circuit 335_2 to output a comparison signal Sc. The delay circuit 335_2 delays the comparison signal Sc for a preset time to output the switching control signal Sw to the switching circuit 313 of the power circuit 310.

Specifically, the filter circuit 320 receives, through the non-inverting input end and inverting input end of the amplifier 321, the input signals Vin1 and Vin2 and provides, through the inverting output end and non-inverting output end of the amplifier 321, the filtered output signals Vout1 and Vout2. The comparators 331_1, 311_2, 311_3 and 311_4 output sub comparison signals to the OR gate 335_1 according to the output signals Vout1 and Vout2 and the reference voltages Vhi and Vlo respectively.

In other words, if any one of the output signals Vout1 and Vout2, which are sine/cosine wave signals, output by the amplifier 321 respectively is not higher than or lower than the preset reference voltages Vhi and Vlo, a logic value of the sub comparison signal output by any one of the comparators 331_1, 331_2, 333_1 and 333_2 is "0", and a logic value of the comparison signal Sc output by the OR gate 335_1 is "0". In the present embodiment, when the logic value of the comparison signal Sc received by the delay circuit 335_2 is "0", the delay circuit 335_2 outputs the switching control signal Sw of which the logic value is "0" to the switching circuit 313 of the power circuit 310. Therefore, the switching circuit 313 may provide the control voltage Vg that is the temperature compensated first voltage V1 for the transistors 323 and 325 to operate the transistors 323 and 325 stably in a cut-off region. The transistors 323 and 325 are equivalent to resistors.

If at least one of the output signals Vout1 and Vout2, which are sine/cosine wave signals, output by the amplifier 321 respectively is higher or lower than the preset reference voltages Vhi and Vlo, it is indicated that the filter circuit 320 is saturated in output and may not implement filtering normally, the logic value of the sub comparison signal output by at least one of the comparators 331_1, 331_2, 333_1 and 333_2 is "1", and the logic value of the comparison signal Sc output by the OR gate 335_1 is "1". In the present embodiment, when the logic value of the comparison signal Sc received by the delay circuit 335_2 is "1", the delay circuit 335_2 delays the comparison signal Sc for the preset time such that the switching control signal Sw of which the logic value is "1" is kept output to the switching circuit 313 of the power circuit 310 for the preset time. Therefore, the switching circuit 313 may keep providing the control voltage Vg that is the fixed second voltage V2 to the transistors 323 and 325 for the preset time to operate the transistors 323 and 325 in a saturation region. Moreover, in the preset time, since the transistors 323 and 325 are switched on, the capacitors 322 and 324 are completely discharged.

The transistors 312, 323 and 325 in the present invention may be N-type transistors or P-type transistors, and the types of the transistors 312, 323 and 325 are not limited in the present invention. In an embodiment, the transistor 123 may be, for example, an NMOS transistor or a PMOS transistor. Moreover, the logic value of each signal in the present invention is not limited to the present embodiment, and the logic value of each signal may be determined according to different logic circuit designs.

Figure 4:
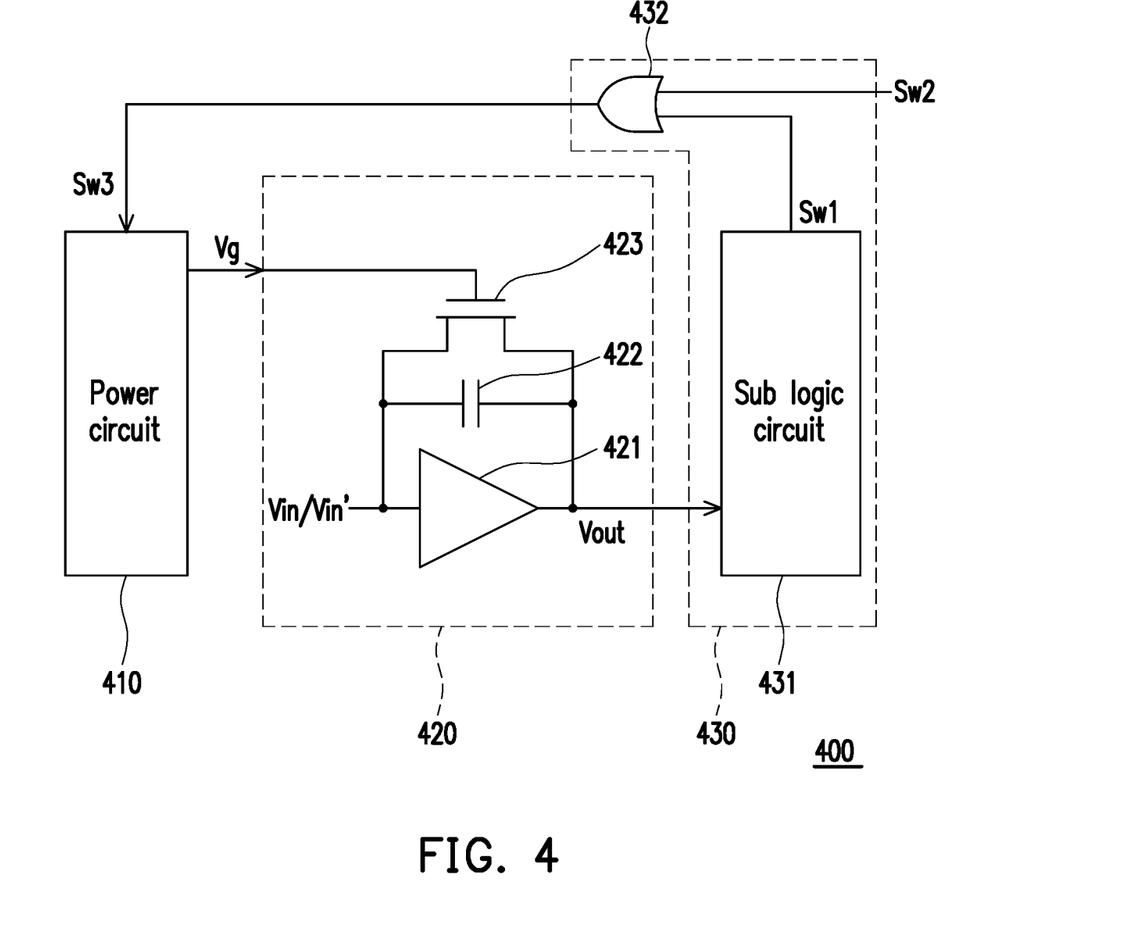
FIG. 4 is a circuit schematic diagram of a filter according to another embodiment of the present invention.
Figure 5:
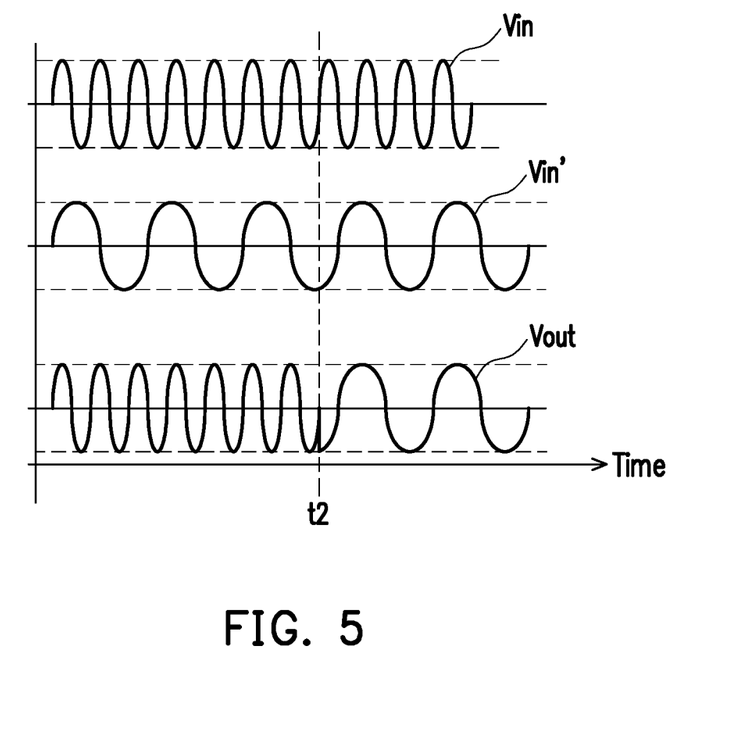
FIG. 5 is a waveform diagram of signals in the embodiment shown in FIG. 4 according to the present invention.

FIG. 4 is a circuit schematic diagram of a filter according to another embodiment of the present invention. FIG. 5 is a waveform schematic diagram of signals in the embodiment shown in FIG. 4 according to the present invention. Referring to FIG. 4 and FIG. 5, the filter 400 includes a power circuit 410, a filter circuit 420 and a logic circuit 430. The filter circuit 420 includes an amplifier 421, a capacitor 422 and a transistor 423. An output end of the amplifier 421 is coupled to the logic circuit 430. A second end of the transistor 423 is coupled to an input end of the amplifier 421, and a first end of the transistor 423 is coupled to the output end of the amplifier 421. A first end of the capacitor 422 is coupled to the output end of the amplifier 421, and the second end of the capacitor 422 is coupled to the input end of the amplifier 421. The transistor 423 is connected in parallel with the capacitor 422, and a control end of the transistor 423 is coupled to the power circuit 410.

Compared with the filter 100 of the embodiment shown in FIG. 1, the logic circuit 430 of the present embodiment further includes a sub logic circuit 431 and an OR gate 432. A function and implementation mode of the sub logic circuit 431 may be the same as those of the logic circuit 130 of the embodiment shown in FIG. 1. The sub logic circuit 431 receives an output signal Vout and generates a switching control signal Sw1 according to the output signal Vout. The OR gate 432 is coupled to the sub logic circuit 431, and receives the switching control signal Sw1 and an external switching control signal Sw2.

In the present embodiment, a plurality of sub input signals Vin and Vin' are switched through the external switching control signal Sw2. The filter circuit 120 receives, through the input end of the amplifier 121, the input signal Vin or Vin' and outputs, through the output end of the amplifier 121, the filtered output signal Vout. The sub input signals Vin and Vin' are sine/cosine wave signals with different cycles, but the present invention is not limited thereto.

The sub logic circuit 431 provides the switching control signal Sw1 to the OR gate 432 according to the output signal Vout. In the present embodiment, when the filter circuit 420 implements filtering normally, a logic value of the switching control signal Sw1 is "0". Moreover, at a time that is not a time point t2, a logic value of the external switching control signal Sw2 is also "0". Therefore, a logic value of a switching control signal Sw3 output by the OR gate 432 is "0", and the power circuit 410 correspondingly provides a temperature compensated control voltage Vg such that the transistor 423 is operated in a cut-off region and the transistor 423 is equivalent to a resistor. On the contrary, when the filter circuit 420 may not implement filtering normally, the logic value of the switching control signal Sw1 is "1", and the logic value of the switching control signal Sw3 output by the OR gate 432 may also correspondingly be "1". Therefore, the power circuit 410 regulates the control voltage Vg to operate and switch on the transistor 423 in a saturation region to reset the filter circuit 420.

At the time point t2, the logic value of the external switching control signal Sw2 is switched to be "1". As shown in FIG. 5, the sub input signal Vin received by the input end of the amplifier 421 is switched to the sub input signal Vin' at the time point t2. The logic value of the switching control signal Sw3 output by the OR gate 432 is switched to be "1". Therefore, the power circuit 410 regulates the control voltage Vg to operate and switch on the transistor 423 in the saturation region to reset the filter circuit 420. In other words, according to the filter 400 of the present embodiment, the filter circuit 420 may be reset to effectively eliminate the conditions of voltage level offset of the output signal Vout, signal waveform distortion or signal waveform offset in a signal switching process of the sub input signals Vin and Vin'.

Figure 6A:
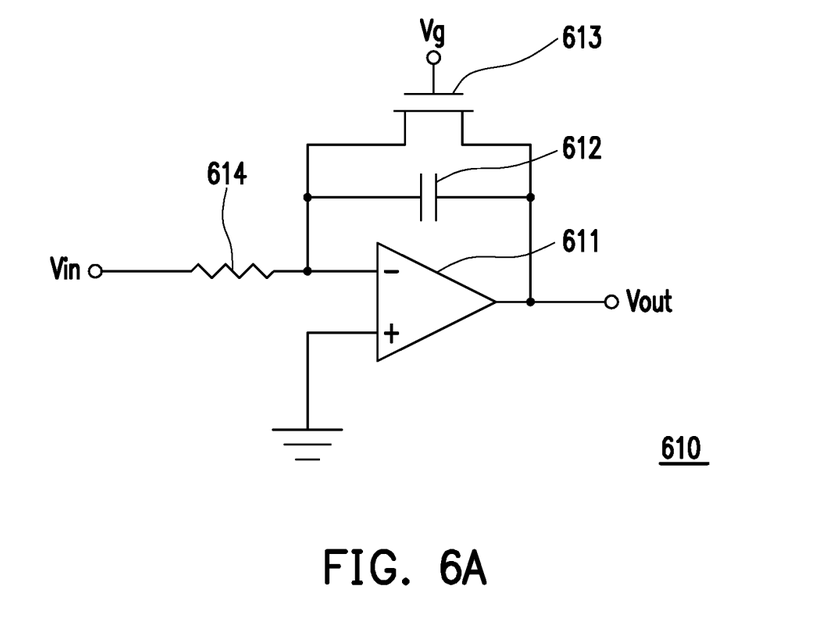
FIG. 6A to FIG. 6C are circuit schematic diagrams of another plurality of implementation modes of a filter circuit according to the present invention.
Figure 6B:
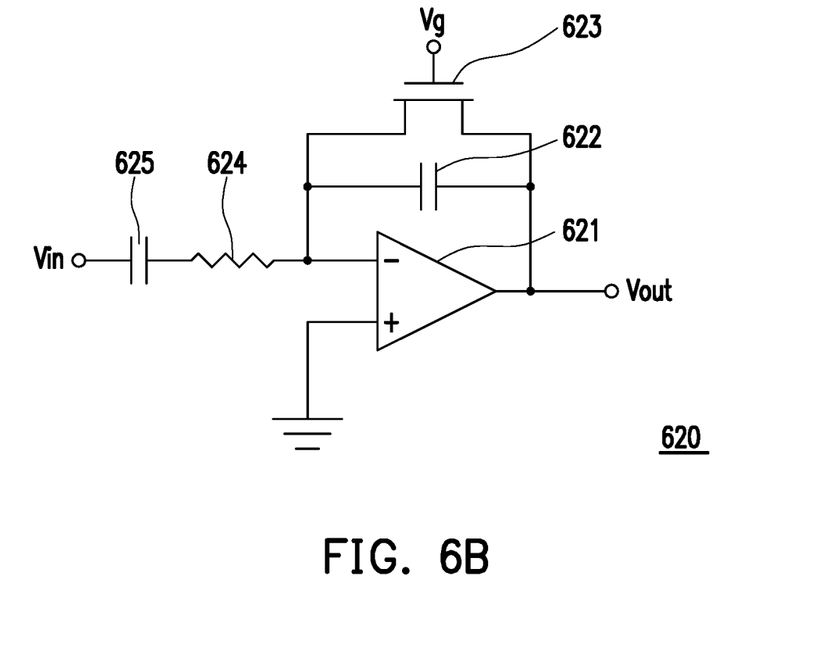
Figure 6C:
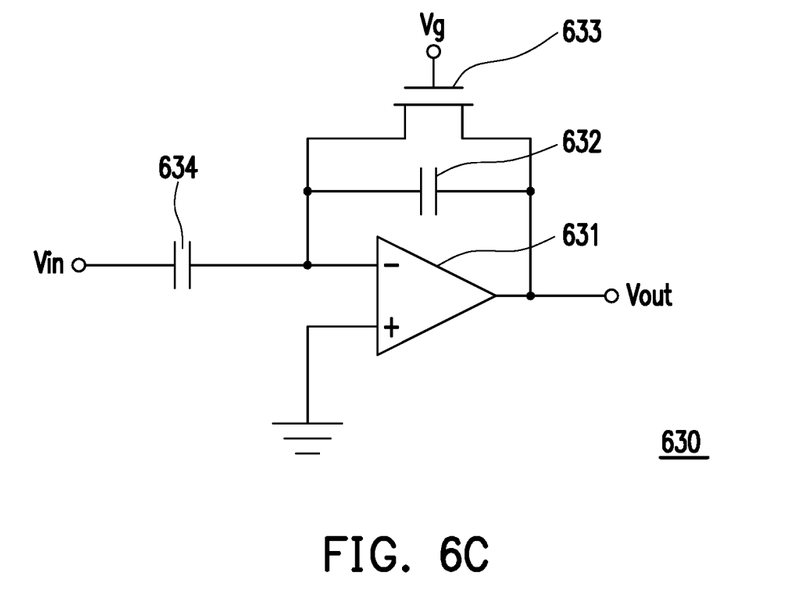

FIG. 6A to FIG. 6C are circuit schematic diagrams of another plurality of implementation modes of a filter circuit according to the present invention. The plurality of implementation modes of the filter circuit in FIG. 6A to FIG. 6C may be applied by analogy to the filter circuit of each embodiment.

As shown in FIG. 6A to FIG. 6C, a filter circuit 610 is a Low-Pass Filter (LPF), a filter circuit 620 is a Band-Pass Filter (BPF), and a filter circuit 630 is a High-Pass Filter (HPF).

When the filter circuits 610, 620 and 630 implement filtering normally, by a temperature compensated control voltage Vg, transistors 613, 623 and 633 may be operated in a cut-off region to make the transistors 613, 623 and 633 equivalent to resistors. When the filter circuits 610, 620 and 630 may not implement filtering normally, the control voltage Vg may be regulated to operate and switch on the transistors 610, 620 and 633 in a saturation region to discharge capacitors 613, 623 and 633, thereby resetting the filter circuits 610, 620 and 630. Therefore, according to the filter circuit of the present embodiment, the influence of a temperature change on the output signal may be effectively reduced, and the filter circuit may be correspondingly reset in case of saturated output.

Figure 7:
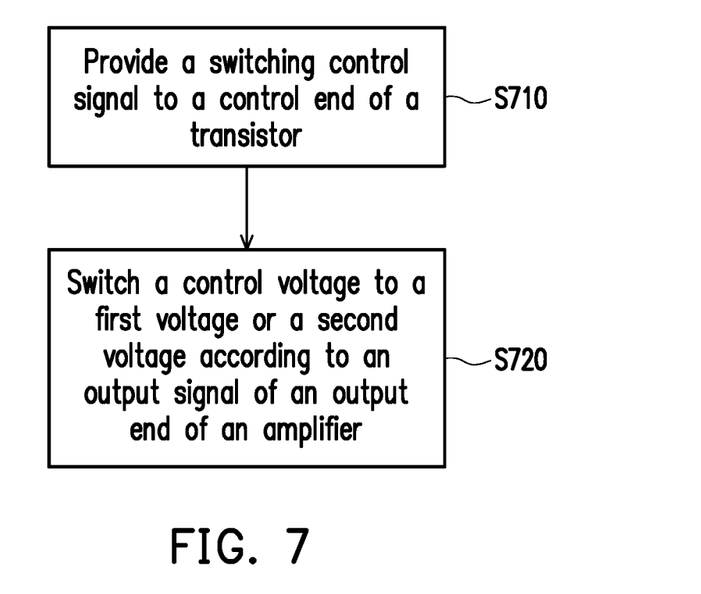
FIG. 7 is a flowchart of an operating method of a filter according to an embodiment of the present invention.

FIG. 7 is a flowchart of an operating method of a filter according to an embodiment of the present invention. Referring to FIG. 1 and FIG. 7, the operating method of the filter of the present embodiment may at least be applied to the filter 100 of the embodiment shown in FIG. 1 such that the filter 100 executes the following steps S710 and S720. In step S710, a power circuit 110 of the filter 100 provides a control voltage Vg to a control end of a transistor 123. In step S720, the power circuit 110 of the filter 100 switches the control voltage Vg to a first voltage or a second voltage according to an output signal Vout of an output end of an amplifier 121. In the present embodiment, the first voltage is a temperature compensated voltage such that the transistor 123 is operated in a cut-off region and is equivalent to a resistor. The second voltage is a fixed voltage such that the transistor 123 is operated and switched on in a saturation region to reset a filter circuit 120. Therefore, according to the operating method of the present embodiment, the temperature compensated first voltage may be provided to the control end of the transistor 123 to effectively enable the filter circuit 120 to implement filtering stably. Moreover, when the filter circuit 120 is required to be reset, according to the operating method of the present embodiment, the fixed second voltage may be provided to the control end of the transistor 123 to discharge a capacitor 122 and correspondingly reset the filter circuit 120.

In addition, enough teachings, suggestions and implementation descriptions may be obtained for other implementation modes, technical details and element characteristics of the operating method and filter 100 of the embodiments of the present invention from the descriptions about the embodiments shown in FIG. 1 to FIG. 6C, and thus elaborations are omitted.

Based on the above, according to the filter and operating method thereof of the present invention, the temperature compensated control voltage may be provided for the control end of the transistor bridged with the input end and output end of the amplifier, and the control voltage may judge whether saturated output occurs or not according to an output signal result of the amplifier to correspondingly operate the transistor to be switched on. Therefore, according to the filter and operating method thereof of the present invention, the influence of the temperature change on the output signal may be effectively reduced, and an effective filter resetting mechanism may be provided.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A filter, comprising:
   a logic circuit, providing a switching control signal;
   a power circuit, coupled to the logic circuit; and
   a filter circuit, coupled to the power circuit and the logic circuit, wherein the filter circuit comprises:
     an amplifier, having an input end and an output end, the output end being coupled to the logic circuit and providing an output signal;
     a first capacitor, coupled between the input end and output end of the amplifier; and
     a first transistor, connected in parallel with the first capacitor, a control end of the first transistor being coupled to the power circuit,
   wherein the logic circuit provides a switching control signal to the power circuit according to the output signal, and the power circuit provides a control voltage to the first transistor according to the switching control signal, and further comprising
   a comparison circuit, coupled to a first output end of the amplifier for judging whether the output signal is higher than a first preset value or lower than a second preset value and outputting a comparison signal.

2. The filter according to claim 1, wherein when the control voltage is a temperature compensated first voltage, the first transistor is operated in a cut-off region, and when the control voltage is a fixed second voltage, the first transistor is operated in a saturation region.

3. The filter according to claim 1, wherein the power circuit comprises:
   a voltage source, providing a second voltage;
   a fixed current source;
   a second transistor, matched with the first transistor and coupled to the fixed current source to generate a first voltage; and
   a switching circuit, coupled to the logic circuit and switching the control voltage to the first voltage or the second voltage according to the switching control signal.

4. The filter according to claim 1, wherein the logic circuit further comprises:
   a delay circuit, coupled to the comparison circuit and the power circuit and delaying the comparison signal for a preset time.

5. The filter according to claim 3, wherein the filter circuit further comprises:
   a second capacitor, coupled between another input end and another output end of the amplifier; and
   a third transistor, connected in parallel with the second capacitor, a control end of the third transistor being coupled to the power circuit, wherein
   the power circuit provides the control voltage to the third transistor according to the switching control signal.

6. The filter according to claim 1, wherein an input signal comprises a plurality of sub input signals, the plurality of sub input signals are switched according to an external switching control signal, and the logic circuit generates the switching control signal according to the external switching control signal and the output signal.

7. An operating method of a filter, the filter comprising an amplifier and a first transistor and the first transistor being coupled between an output end and input end of the amplifier, the operating method comprising:
   providing a control voltage to a control end of the first transistor;
   switching the control voltage to a first voltage or a second voltage according to an output signal of the output end of the amplifier; and
   comparing whether the output signal is higher than a first preset value or lower than a second preset value and outputting a comparison signal.

8. The operating method according to claim 7, wherein when the control voltage is a temperature compensated first voltage, the first transistor is operated in a cut-off region, and when the control voltage is the fixed second voltage, the first transistor is operated in a saturation region.

9. The operating method according to claim 7, further comprising:
   generating the first voltage according to a second transistor matched with the first transistor and a fixed current source.

* * * * *